United States Patent
Tai et al.

(10) Patent No.: US 7,205,532 B2
(45) Date of Patent: Apr. 17, 2007

(54) INTEGRATED BALL GRID ARRAY OPTICAL MOUSE SENSOR PACKAGING

(75) Inventors: Li Chong Tai, Penang (MY); Angeline Khoo, Penang (ML); Ban Kuan Koay, Penang (ML)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 62 days.

(21) Appl. No.: 10/924,474

(22) Filed: Aug. 24, 2004

(65) Prior Publication Data

US 2006/0043277 A1   Mar. 2, 2006

(51) Int. Cl.
*H01L 27/14* (2006.01)
(52) U.S. Cl. .............. 250/239; 257/433; 257/434; 257/680; 345/163; 345/166
(58) Field of Classification Search .............. 250/239, 250/208.1, 221; 357/431–434, 678, 680
See application file for complete search history.

(56) References Cited

U.S. PATENT DOCUMENTS

| | | | |
|---|---|---|---|
| 6,037,641 A * | 3/2000 | Goel | 257/432 |
| 6,143,588 A * | 11/2000 | Glenn | 438/116 |
| 6,384,397 B1 * | 5/2002 | Takiar et al. | 250/208.1 |
| 6,483,101 B1 * | 11/2002 | Webster | 250/216 |
| 6,882,021 B2 * | 4/2005 | Boon et al. | 257/434 |
| 6,930,327 B2 * | 8/2005 | Maeda et al. | 257/434 |
| 6,969,898 B1 * | 11/2005 | Exposito et al. | 257/434 |
| 2003/0034441 A1 * | 2/2003 | Kang et al. | 250/221 |
| 2004/0113890 A1 * | 6/2004 | Ranta | 345/166 |
| 2005/0184219 A1 * | 8/2005 | Kirby | 250/208.1 |

* cited by examiner

*Primary Examiner*—Thanh X. Luu
*Assistant Examiner*—Stephen Yam

(57) ABSTRACT

A compact optical sensor package for use in an optical mouse. The optical sensor package includes a chip enclosure which is physically and electrically bonded to a main circuit Board using Ball Grid Array (BGA) technology. The chip enclosure includes a windowed cover having a window, and a base board hermetically sealed to the windowed cover to enclose the sensor chip. The sensor chip is electrically connected to bonding pads on the inner surface of the base plate. The bonding pads are electrically connected through the base plate to bonding pads on the outer surface of the base plate. The bonding pads on the outer surface of the base plate are elements in this application of Ball Grid Array technology.

13 Claims, 3 Drawing Sheets

INTEGRATED BALL GRID ARRAY OPTICAL MOUSE SENSOR PACKAGING

CROSS-REFERENCE TO RELATED APPLICATIONS

Not applicable.

BACKGROUND OF THE INVENTION

In the field of computer input devices, it is very common to control the movement of a cursor on a computer screen, or to use that cursor for instruction selection, by employing a device called a "mouse". A "mouse" is a device electrically connected to the computer and capable of being moved over a surface by the hand of the computer operator. The motion of the mouse over the surface is electronically communicated to the computer to control the movement of a cursor on the screen of the computer. The mouse also includes buttons, which electronically communicate instructions to the computer. In the traditional design, the motion between the mouse and the surface was monitored by the rotation of a rubber ball in the mouse. However, in modern construction, the motion between the surface and the mouse is monitored using an optical sensor which is able to monitor and communicate movement between the mouse and the surface to the computer in a very reliable manner.

Although the typical semiconductor sensor chip, which bears the actual optical sensor electronics, has an area of approximately 4.33 mm$^2$, the practical application of the sensor chip requires packaging technology that currently has a much greater area. Packaging technology refers to containers, supports, and electrical and thermal connections necessary to physically support the chip and electronically connect the chip to the peripheral electronic equipment needed for the chip to perform its function. The current optical mouse sensor packaging technology (DIP of Dual Inline Pin) has an area generally greater than 122.65 mm$^2$. Integrated circuit packaging is an essential part of protecting semiconductor chips from being directly exposed to factors that might cause damage and cause the chip to malfunction, such as heat, air, moisture, and/or vibration. In addition to functioning as a protective shield, packaging serves as a medium to connect the internal circuitry of the semiconductor chip to the outside world. Thus, conventional packaging technology employs an area which is approximately 28 times the area of the actual sensor chip. The relatively large area of the currently necessary packaging technology places a significant size limitation on the designs that can be selected for use of the sensor in the mouse, particularly with regard to alternative designs for mice such as the pen mouse, which is shaped like and held like a pen, or other integrated input devices and pointers.

These and other shortcomings of the prior art optical mouse sensor package have been resolved in a novel manner by the present invention.

BRIEF SUMMARY OF THE INVENTION

This invention provides a compact optical sensor packaging system for use in an optical mouse. The optical sensor packaging system comprises a chip enclosure which is physically and electrically bonded to a main circuit board using Ball Grid Array (BGA) technology. The chip enclosure comprises a windowed cover defining a window that provides an optical path through the windowed cover. The chip enclosure also comprises a base board hermetically sealed to the windowed cover to enclose the sensor chip. The sensor chip is electrically connected to bonding pads on the inner surface of the base plate. The bonding pads are electrically connected through the base plate to pads on the outer surface of the base plate. The pads on the outer surface of the base plate are employed as an element in the Ball Grid Array technology.

BRIEF DESCRIPTION OF THE DRAWINGS

The invention, however, may best be understood by reference to an example, as shown in the accompanying drawings, in which.

DETAILED DESCRIPTION OF THE INVENTION

The integrated circuit packaging system of the present invention protects chips from exposure to factors such as heat, air, moisture, and/or vibration that might cause damage and cause the chip to malfunction. In addition to providing protection, the packaging serves as a medium to connect the internal circuitry of the chip to the outside world. The compact packaging system of the present invention, and especially its small area, allows a designer more latitude in product design. Further more, the compact packaging system benefits from the enhanced electrical performance because of shorter signal paths.

The following embodiment of this invention shows how the small-form-factor packaging invention can be used to accomplish these goals.

Figure 1:
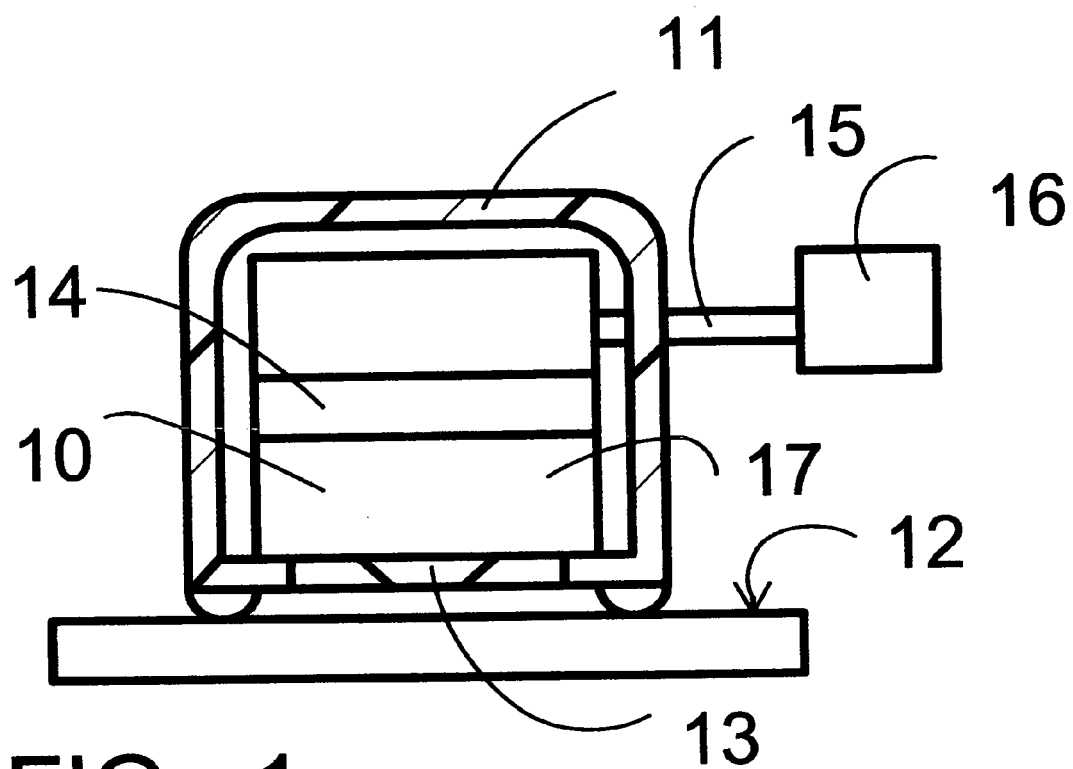
FIG. 1 is a side view, in section, of an optical mouse and optical chip packaging system embodying the principles of the present invention.

Referring first to FIG. 1, which shows the general features of the present invention, the optical sensor packaging system 10 is shown enclosed within an optical mouse 11 which is sectioned so that the optical sensor packaging system 10 is visible. The mouse 11 rests on a surface 12. The window 13 of the optical sensor packaging system 10 provides an optical path between the chip 24 and the surface 12. In the conventional manner, light reflected from the surface 12 enters the window 13, so that the mouse 11 is able to monitor the movement of the mouse 11 on the surface 12.

The optical sensor packaging system 10 electronically communicates information about the movement of the mouse 11 on the surface 12 to a mouse electronics package 14. The mouse electronics package 14 communicates the information about the movement of the mouse 11 on the surface 12, through a communication link 15, to the target computer 16. The target computer 16 uses that information, typically to cause corresponding movement of a cursor on a video screen.

Figure 2:
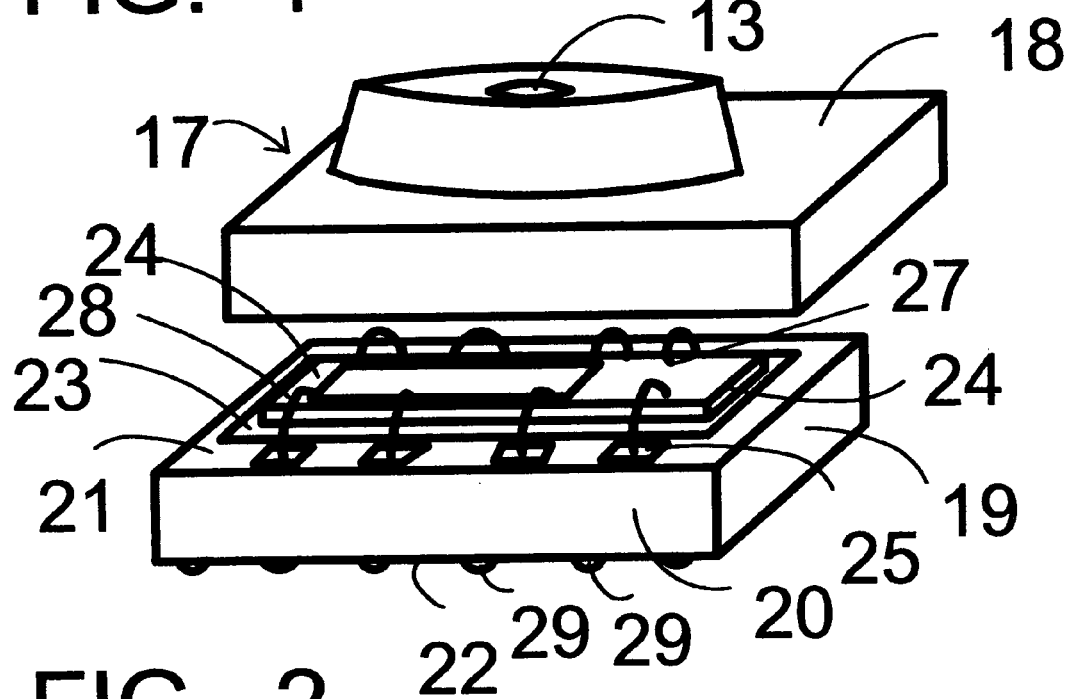
FIG. 2 is a perspective view of a chip enclosure, prior to assembly, which is part of the optical chip packaging system embodying the principles of the present invention.

Referring to FIG. 2, in which the chip enclosure 17 is shown inverted so that the window 13 faces up, the general features of the chip enclosure 17 are a windowed cover 18 bearing the window 13, and a base board 19. In this embodiment, the base board 19 is a small piece of printed circuit board. The base board 19 has a peripheral edge 20, an inner surface 21 and an outer surface 22. A ground plate 23 is mounted in the central portion of the inner surface 21. The optical chip 24 is mounted on the central portion of the ground plate 23. The inner surface 21 of the base board 19 includes electrically conductive bonding pads 25 which are electrically connected through the base board 19 to corresponding electrically conductive pads 26 (shown in FIGS. 4, 5, and 7) on the outer surface 22 of the base board 19. The electrical input and output connections 27 on the chip 24 are connected by wire bonds 28 to the pads 25. The electrically conductive pads 26 (shown in FIGS. 4, 5, and 7) carry solder balls 29 suitable for use in a ball grid array (BGA).

Figure 3:
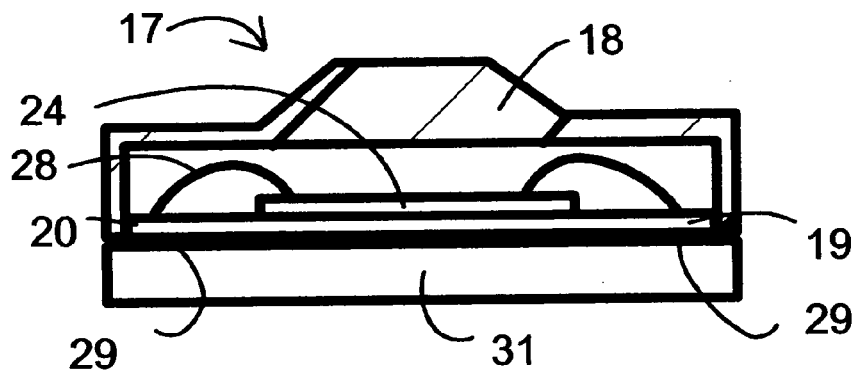
FIG. 3 is a side sectional view of an optical chip packaging system embodying principles of the present invention.

FIG. 3 shows a side view of the manner in which the chip enclosure 17, including the windowed cover 18 and the base board 19, is mounted to a main board 31. In the preferred embodiment, the base board 19 is mounted to the main board 31 using Ball Grid Array (BGA) technology. The the main board 31 extends only a small distance beyond the peripheral edge 20 of the base board 19 so that the total area of the packaging system 10 is minimized, and is only slightly larger than that of the base board 19.

Although Ball Grid Array technology is the method for electrically connecting the base board 19 to the main board 31 exemplified above, other attachment techniques can be used. For example, the attachment could be done using a SMT (surface mount technology) reflow or gluing processes.

Figure 4:
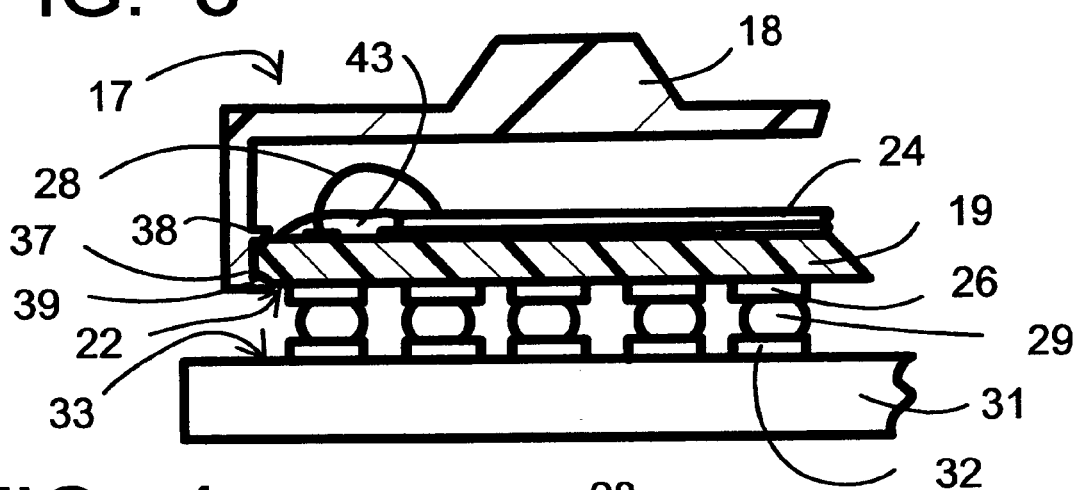
FIG. 4 is an enlarged view of part of the optical chip packaging system shown in FIG. 3.
Figure 5:
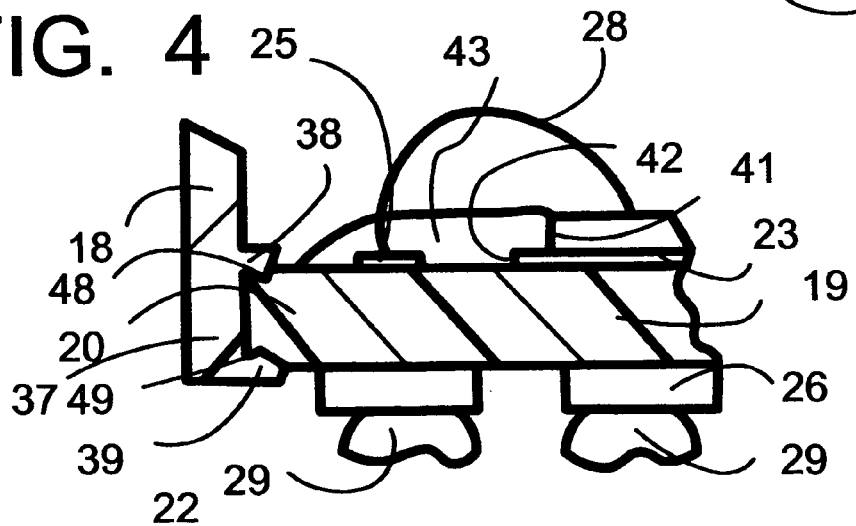
FIG. 5 is an enlarged view of the optical chip packaging system shown in FIG. 4.

FIG. 4 shows a sectional and side view of the physical and electrical connection between the base board 19 and the main board 31. The electrically conductive pads 26 on the outer surface of the base board 19, are electrically connected through solder balls 29, to electrically conductive pads 32 on the main board 31, using Ball Grid Array (BGA) technology. Specifically, the solder balls 29 form a solder connection between the bonding pads 26 on the outer surface 22 of the base board 19 and the pads 32 on the inner surface 33 of main board 31.

FIG. 4 also shows that the inner edge 37 of the windowed cover 18 is provided with flexible peripheral inner lips 38 and peripheral outer lips 39. The inner lips 38 and outer lips 39 engage peripheral grooves 48 and 49 near the inner and outer edges of the peripheral edge 20 of the base board 19 to form a hermetic seal between the windowed cover 18 and the base board 19 to seal the chip enclosure 17. This is also shown in more detail in FIG. 5, with peripheral grooves 48 and 49 in the inner and outer surfaces 21 and 22, respectively, of the base board 19, with the grooves being engaged by the lips 38 and 39 to enhance the seal.

FIG. 4 is a further enlarged view and also shows the periphery 41 of the chip 24, the periphery 42 of the ground plate 23 and the bonding pads 25 encapsulated with a transparent silicone coating 43 to physically stabilize the wire bonds 28. The coating 43 extends up to, but not over the periphery 41 of the chip 24.

Figure 6:
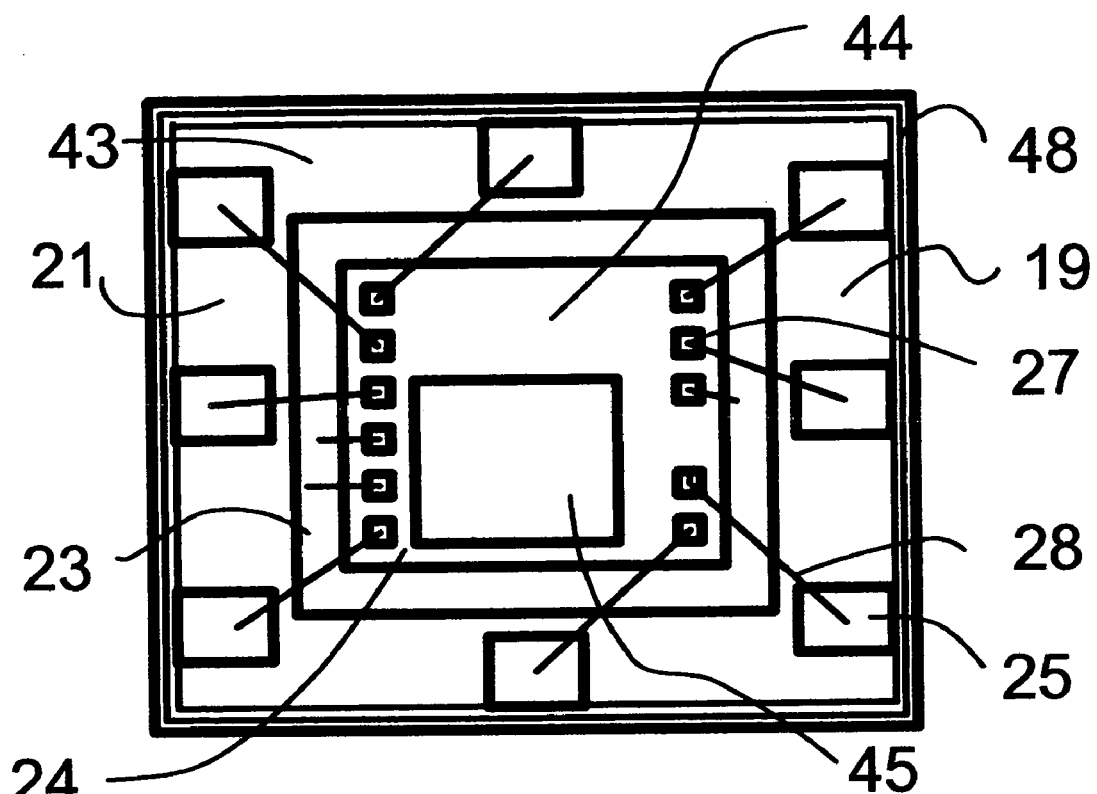
FIG. 6 is a plan view of a base board and optical chip structure employed in the optical chip packaging system embodying the principles of the present invention.

FIG. 6 shows a plan view of base board 19 showing its inner surface 21. Positioned near the perimeter of the inner surface 21 are electrically conductive package bonding pads, an exemplary one of which is shown at 25. The ground plate 23 is mounted centrally on the inner surface 21. The chip 24 is mounted centrally on the ground plate 23. A portion on the inner surface 44 of the chip 24 constitutes an optical zone 45. The chip enclosure 17 is designed so that the optical zone 45 aligned with the window 13 when the device is assembled. Chip bonding pads 27 are positioned around the periphery of the inner surface 44 of the chip 24. Wire bonds 28 electrically connect some of the chip bonding pads 27 to the appropriate package bonding pads 25 and others of the chip bonding pads 25 to the ground plate 23. The package bonding pads 25 and the outer ends of the wire bonds are encased in the transparent silicone coating 43 (See also FIG. 5).

Figure 7:
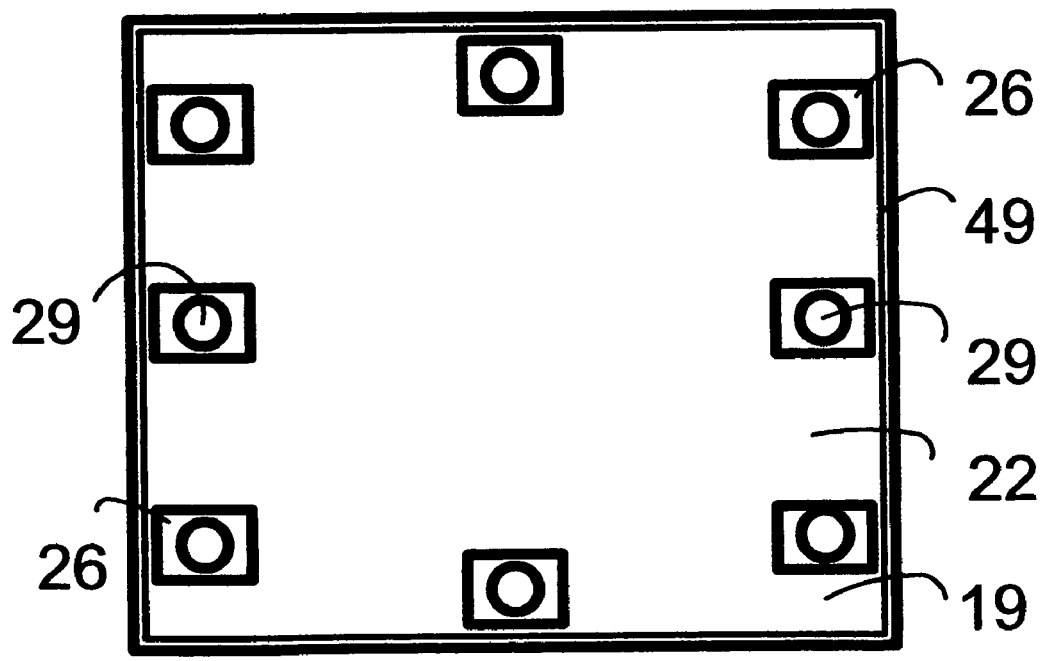
FIG. 7 is a bottom view of a base board employed in the optical chip packaging system embodying principles of the present invention.

FIG. 7 shows the outer surface 22 of the base board 19. Electrically conductive external bonding pads 26 are located on the surface 22 and each bonding pad 26 carries a solder ball 29, appropriate for forming electrical and physical connections using Ball Grid Array (BGA) technology, to electrically connect and physically attach the base board 19 to the main board 31.

FIG. 7 shows the solder ball pin out arrangement for 8 pin input/output. For 8 pin input/output, the pin out is arranged in a three by three matrix, without the ninth central pin and ball. Alternatively, for sixteen pin out, the arrangement is 4 by 4 input/output and for 20 pin out, it will be five by four input/output. Thus, any number of pin input/output requirements can be accommodated.

With the inclusion and implementation of the present compact optical sensor packaging invention into an optical mouse, the optical mouse does not have to look like a conventional desk mouse, as is now required by the current large area package. Because a mouse using the packaging technology of this invention has a very small area perpendicular to the optical path of the chip, the mouse can be designed in a wide range of shapes and/or sizes, such as tube shaped or triangular shaped, in accordance with the customer's preferences. Furthermore, it is possible for an optical sensor using this packaging technology to be formed as a pen mouse, and any other integrated input device.

The invention claimed is:

1. A package for an optical chip, the package comprising:
   (a) a chip enclosure shaped to enclose the optical chip and comprising a windowed cover and a base board, the base board having a chip mounting area, the windowed cover comprising a transparent window; and
   (b) solder balls disposed on the surface of the base board opposite the chip mounting area, said solder balls electrically connecting the base board to a main board, wherein a peripheral edge of the main board and a peripheral edge of the base board extend substantially the same distance, wherein the base board has an inner surface, an outer surface, and a periphery, and bonding pads on the inner surface and on the outer surface, and electrical connections extending though the base board between the bonding pads on the inner surface and the bonding pads on the outer surface.

2. An optical sensor packaging system as recited in claim 1, wherein the windowed cover has a periphery shaped to form a hermetic seal with the periphery of the base board.

3. An optical sensor packaging system as recited in claim 1, wherein the windowed cover has a periphery formed with a peripheral inner lip, and a peripheral outer lip shaped to engage the periphery of the base board to form a hermetic seal with the periphery of the base board.

4. An optical sensor packaging system as recited in claim 1, wherein the optical chip is mounted on the inner surface of the base board and is electrically connected to the bonding pads on the inner surface of the base board.

5. An optical sensor packaging system as recited in claim 1, wherein the optical chip is mounted on the inner surface of the base board and is electrically connected to the bonding pads on the inner surface of the base board, and a body of electrically non-conductive material is placed on the bonding pads on the inner surface of the base board to physically protect the bonding pads on the inner surface of the base board.

6. An optical sensor packaging system, comprising:
(a) an optical chip;
(b) a chip enclosure for enclosing the optical chip and comprising a windowed cover and a base board having an area, the windowed cover comprising a transparent window;
(c) a main board distinct from the base board; and
(d) solder balls disposed on the surface of the base board and on the surface of the main board to physically and electrically connect the base board to the main board within the area of the base board, wherein a peripheral edge of the main board and a peripheral edge of the base board extend substantially the same distance, wherein the base board has an inner surface, and an outer surface, and a periphery, and the windowed cover has a periphery formed with a peripheral inner lip, and a peripheral outer lip shaped to engage the periphery of the base board to form a hermetic seal with the periphery of the baseboard.

7. A optical sensor package, comprising:
(a) an optical chip;
(b) a chip enclosure shaped to enclose the optical chip and comprising a windowed cover and a base board, the base board having a chip mounting area, carrying the chip, the windowed cover comprising a transparent window;
(c) a main board distinct from the base board; and
(d) solder balls disposed on the surface of the base board opposite the chip mounting area, and connecting the base board to the main board, wherein a peripheral edge of the main board and a peripheral edge of the base board extend substantially the same distance, wherein the base board has an inner surface, an outer surface, and a periphery, and the windowed cover has a periphery with a peripheral inner lip and a peripheral outer lip shaped to engage the inner and outer edges of the periphery to form a hermetic seal with the periphery of the base board.

8. An optical mouse, comprising:
(a) a mouse body;
(b) an optical sensor package mounted in the body, the package comprising:
(i) an optical chip;
(ii) a chip enclosure shaped to enclose the optical chip and comprising a windowed cover and a base board, the base board having a chip mounting area, the windowed cover comprising a transparent window;
(iii) a main board distinct from the base board; and
(iv) solder balls disposed on a surface of the main board opposite the chip mounting area, and connecting the base board and the main board within the area of the base board, wherein a peripheral edge of the main board and a peripheral edge of the base board extend substantially the same distance, wherein the base board has an inner surface, an outer surface, and a periphery, and bonding pads on the inner surface and on the outer surface, and electrical connections extending through the base board between the bonding pads on the inner surface and the bonding pads on the outer surface.

9. An optical mouse as recited in claim 8, wherein the windowed cover has a periphery shaped to form a hermetic seal with the periphery of the base board.

10. An optical mouse as recited in claim 8, wherein the windowed cover has a periphery formed with a peripheral inner lip, and a peripheral outer lip shaped to engage the periphery of the base board to form a hermetic seal with the periphery of the base board.

11. An optical mouse as recited in claim 8, wherein the optical chip is mounted on the inner surface of the base board and is electrically connected to the bonding pads on the inner surface of the base board.

12. An optical mouse as recited in claim 8, wherein the optical chip is mounted on the inner surface of the base board and is electrically connected to the bonding pads on the inner surface of the base board, and a body of electrically non-conductive material is placed on the bonding pads on the inner surface of the base board to physically protect the bonding pads on the inner surface of the base board.

13. An optical mouse, comprising:
(a) an optical mouse body;
(b) an optical sensor package, comprising:
(i) an optical chip;
(ii) a chip enclosure for enclosing the optical chip and comprising a windowed cover and a base board, the windowed cover comprising a transparent window, and the base board having a chip mounting area;
(iii) a main board distinct from the base board; and
(iv) solder balls disposed on a surface of the base board opposite the chip mounting area and connecting the base board and the main board within the area of the base board;
(c) a mouse electronics package for receiving electrical signal from the main board; and
(d) a communication link between the mouse electronics package and a computer;
wherein the base board has an inner surface and an outer surface and a periphery, and the windowed cover has a periphery which has a peripheral inner lip and a peripheral outer lip shaped to engage the inner and outer edges of the periphery of the base board so that the periphery of the windowed cover forms a hermetic seal to the periphery of the base board, and
wherein the base board has bonding pads on the inner surface and on the outer surface, and electrical connections extending through the base board between the bonding pads on the inner surface and the bonding pads on the outer surface, and
wherein the optical chip is mounted on the inner surface of the base board and electrically connected to the bonding pads on the inner surface of the base board, and a body of electrically non-conductive material is placed on the bonding pads on the inner surface of the base board to physically protect the bonding pads on the inner surface of the base board.

* * * * *

UNITED STATES PATENT AND TRADEMARK OFFICE
CERTIFICATE OF CORRECTION

| | | |
|---|---|---|
| PATENT NO. | : 7,205,532 B2 | Page 1 of 1 |
| APPLICATION NO. | : 10/924474 | |
| DATED | : April 17, 2007 | |
| INVENTOR(S) | : Li Tai | |

It is certified that error appears in the above-identified patent and that said Letters Patent is hereby corrected as shown below:

Col. 4 Line 55 In Claim 1, delete "though" and insert -- through --, therefor.

Col. 5 Line 29 In Claim 6, delete "baseboard" and insert -- base board --, therefor.

Col. 6 Line 40 In Claim 13, delete "signal" and insert -- signals --, therefor.

Signed and Sealed this

Sixteenth Day of December, 2008

JON W. DUDAS
*Director of the United States Patent and Trademark Office*